(12) United States Patent
Kurita et al.

(10) Patent No.: US 7,839,151 B2
(45) Date of Patent: Nov. 23, 2010

(54) SOLID ELECTROLYTIC CAPACITOR INSPECTION DEVICE AND INSPECTION METHOD

(75) Inventors: Junichi Kurita, Osaka (JP); Hiroshi Higashitani, Osaka (JP); Kazuo Kawahito, Osaka (JP); Tsuyoshi Yoshino, Kyoto (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 11/885,944

(22) PCT Filed: Apr. 18, 2006

(86) PCT No.: PCT/JP2006/308098

§ 371 (c)(1),
(2), (4) Date: Sep. 7, 2007

(87) PCT Pub. No.: WO2006/115110

PCT Pub. Date: Nov. 2, 2006

(65) Prior Publication Data

US 2008/0169825 A1      Jul. 17, 2008

(30) Foreign Application Priority Data

Apr. 20, 2005    (JP) .............................. 2005-122069

(51) Int. Cl.
*G01R 31/12* (2006.01)
(52) U.S. Cl. ...................... 324/548; 324/755; 324/758
(58) Field of Classification Search .................. 324/548
See application file for complete search history.

(56) References Cited

U.S. PATENT DOCUMENTS 4,075,556 A * 2/1978 Seaman ...................... 324/658
5,038,100 A * 8/1991 Kushner et al. ............. 324/754
5,406,211 A * 4/1995 Inoue et al. ................. 324/758
5,657,207 A * 8/1997 Schreiber et al. ............ 361/774
5,821,758 A * 10/1998 Jindal ......................... 324/512
6,206,937 B1 * 3/2001 Kudoh et al. ............... 29/25.03

(Continued)

FOREIGN PATENT DOCUMENTS

JP        2001-035759        2/2001

(Continued)

OTHER PUBLICATIONS

Agilent Application Note AN 1287-9, In-Fixture Measurements Using Vector Network Analyzers, copyright1999, 2000, Agilent Technologies, Inc, Printed 8/00.*

(Continued)

*Primary Examiner*—Melissa J Koval
*Assistant Examiner*—Benjamin M Baldridge
(74) *Attorney, Agent, or Firm*—McDermott Will & Emery LLP

(57) ABSTRACT

A capacitor inspection device includes a substrate made of an insulating material, a first conductor unit and a second conductor unit arranged on the substrate, a signal input unit and a signal output unit attached to the substrate, a network analyzer and a pressurizing unit. The network analyzer has an input port connected to the signal input unit and an output port connected to the signal output unit. The first and second conductor units make contact with an anode and a cathode of a capacitor, respectively. The pressurizing unit presses the anode of capacitor onto the first conductor unit and the cathode onto the second conductor unit.

13 Claims, 13 Drawing Sheets

U.S. PATENT DOCUMENTS

| | | | |
|---|---|---|---|
| 6,294,257 B1 * | 9/2001 | Tsukakoshi et al. | 428/400 |
| 6,489,790 B1 * | 12/2002 | An et al. | 324/755 |
| 2004/0174172 A1 * | 9/2004 | Kamitani | 324/500 |
| 2006/0109609 A1 | 5/2006 | Kobayashi et al. | |

FOREIGN PATENT DOCUMENTS

| | | |
|---|---|---|
| WO | WO 00/04394 | 1/2000 |
| WO | WO 03/107365 A1 | 12/2003 |

OTHER PUBLICATIONS

Agilent Application Note AN 1287-9, In-Fixture Measurements Using Vector Network Analyzers, copyright1999, 2000, Agilent Technologies, Inc, Printed 8/00 (Furnished in a previous office action).*

Agilent LCR Meters, Impedance Analyzers and Test Fixtures Selection Guide, Copyright Agilent Technologiess, 2003, 2004, printed Feb. 4, 2005, pp. 10-16.*

* cited by examiner

PRIOR ART

PRIOR ART

SOLID ELECTROLYTIC CAPACITOR INSPECTION DEVICE AND INSPECTION METHOD

RELATED APPLICATIONS

This application is the U.S. National Phase under 35 U.S.C. §371 of International Application No. PCT/JP2006/308098 filed on Apr. 18, 2006, which in turn claims the benefit of Japanese Application No. 2005-122069, filed on Apr. 20, 2005 the disclosure of which Application is incorporated by reference herein.

TECHNICAL FIELD

The present invention relates to a solid electrolytic capacitor inspection device suitable for measuring solid electrolytic capacitors used for many kinds of electronic apparatus with respect to equivalent series inductance among characteristics thereof. The present invention also relates to an inspection method which uses the inspection device.

BACKGROUND ART

In the recent growing trends among electronic devices towards the use of the higher frequency, the capacitors nowadays are required to be superior in the impedance characteristic at the higher frequency region. In order to meeting such requirements, solid electrolytic capacitors have been developed using a conductive polymer having high electrical conductivity as a solid electrolyte.

There are also strong requests that those solid electrolytic capacitors for use in the periphery of microprocessors (CPU) in personal computers, etc. are compact in size yet having a large capacitance. As the results of the shift towards the higher frequency region, reduction of the equivalent series inductance (ESL) is urged, besides reduction of the equivalent series resistance (ESR). The capacitors are further required to provide superior performance in the noise reduction and in the transient response capability. Various efforts are made in order to satisfy these demands.

The solid electrolytic capacitors are used specifically in the following sectors such as the power supply circuits, digital circuits and the like circuits where the low impedance at high frequency region is specially required. For the purpose of precise inspection of these electrolytic capacitors with respect to the impedance, the following inspection device has been proposed.

FIG. 13 is a conceptual view of a conventional inspection device used for measuring the impedance of solid electrolytic capacitors. In the drawing, the portion surrounded with dotted lines represents impedance measurer 50 illustrated simplified. Impedance measurer 50 includes alternating power supply 51, current limiting resistor 52, current detector 53 for detecting a current flow to capacitor 54, voltage detector 55, current terminals 56, 57 and voltage terminals 58, 59.

Current probes 60, 61 and voltage probes 62, 63 are used for making contact with electrodes of capacitor 54 which is an object of measurement, when measuring the impedance. Resistor 65 is provided between lead end 64 drawn from current terminal 56 and current probe 60 via, while resistor 67 is provided between lead end 66 drawn from voltage terminal 58 and voltage probe 62. Detection resistor 68 is provided between lead end 64 and lead end 66. Likewise, there are resistor 70 between current probe 61 and lead end 69, resistor 72 between voltage probe 63 and lead end 71, and detection resistor 73 between lead end 69 and lead end 71. It is preferred that detection resistors 68, 73 have sufficiently greater resistance value (10Ω-100Ω) than the contact resistance of probes 60-63; however, detection resistors 78, 73 can be eliminated.

FIG. 14 is an equivalent circuit diagram of the impedance inspection device shown in FIG. 13; the portion surrounded with dotted lines represents impedance measurer 50 illustrated simplified. Capacitor 54 has capacitance 54A and equivalent series resistance 54B. There are resistivity 65A and inductive component 74 between current probe 60 and lead end 64 via resistor 65. Likewise, there are resistivity 70A and inductive component 75 between current probe 61 and lead end 69 via resistor 70. There are resistivity 67A and inductive component 76 between voltage probe 62 and lead end 66 via resistor 67. There are resistivity 72A and inductive component 77 between voltage probe 63 and lead end 71 via resistor 72.

In the above-described setup, the impedance of capacitor 54 is measured as follows: At first, it is corrected at open state and at short-circuit state without setting capacitor 54. And then, current probes 60, 61 and voltage probes 62, 63 are brought to make contact with the electrodes of capacitor 54 at both ends, for having an alternating current from alternating power supply 51 applied between current probes 60 and 61. Voltage caused at the both ends of capacitor 54 is detected by voltage detector 55 through voltage probes 62, 63. Current (I) and voltage (V) are detected at this moment by voltage detector 55 and current detector 53, and impedance Z is calculated using the Formula Z=V/I.

Current probes 60, 61 and voltage probes 62, 63 are in contact with the electrodes of capacitor 54. Therefore, resistivity 65A, 70A, 67A, 72A as well as inductive component 74, 75, 76, 77 of probes 60-63 are corrected to be 0 on the electrical equivalent circuit. In this way, impedance measurer 50 can measure the impedance precisely. Such an impedance inspection device is disclosed in Japanese Patent Unexamined Publication No. 2001-35759, for example.

The above-described conventional inspection device aims to measure the impedance of capacitor 54 which is an object of measurement, on a production line within a very short time. So, the ESL of a capacitor can be known based on the measurement results. The accuracy level of the measurement, however, is not high enough for measuring the impedance of solid electrolytic capacitors whose ESL is expected to be low.

SUMMARY OF THE INVENTION

The present invention offers an inspection device for inspecting the ESL characteristic of solid electrolytic capacitors within a very short time and at a high accuracy level. An inspection method using the inspection device is also offered in the invention. A capacitor inspection device in the present invention includes a substrate made of an insulating material, a first conductor unit and a second conductor unit, a network analyzer, a signal input unit, a signal output unit, and a pressurizing unit. The first and the second conductor units are provided on the substrate in the form of conductor pattern. The first conductor unit is in contact with the anode of the capacitor, while the second conductor unit is in contact with the cathode of the capacitor. The network analyzer has an input port and an output port. The signal input unit is coupled with the input port, and attached to the substrate. The signal output unit is coupled with the output port and attached to the substrate. The pressurizing unit presses the anode of capacitor to the first conductor unit, and the cathode of capacitor to the second conductor unit. The structure of a solid electrolytic capacitor inspection device in the present invention is simple, but it can measure precisely the ESL of solid electrolytic capacitors within a very short time, without accompanying unwanted impedance such as resistance, etc.

DETAILED DESCRIPTION OF PREFERRED EMBODIMENTS

First Exemplary Embodiment

Figure 1:
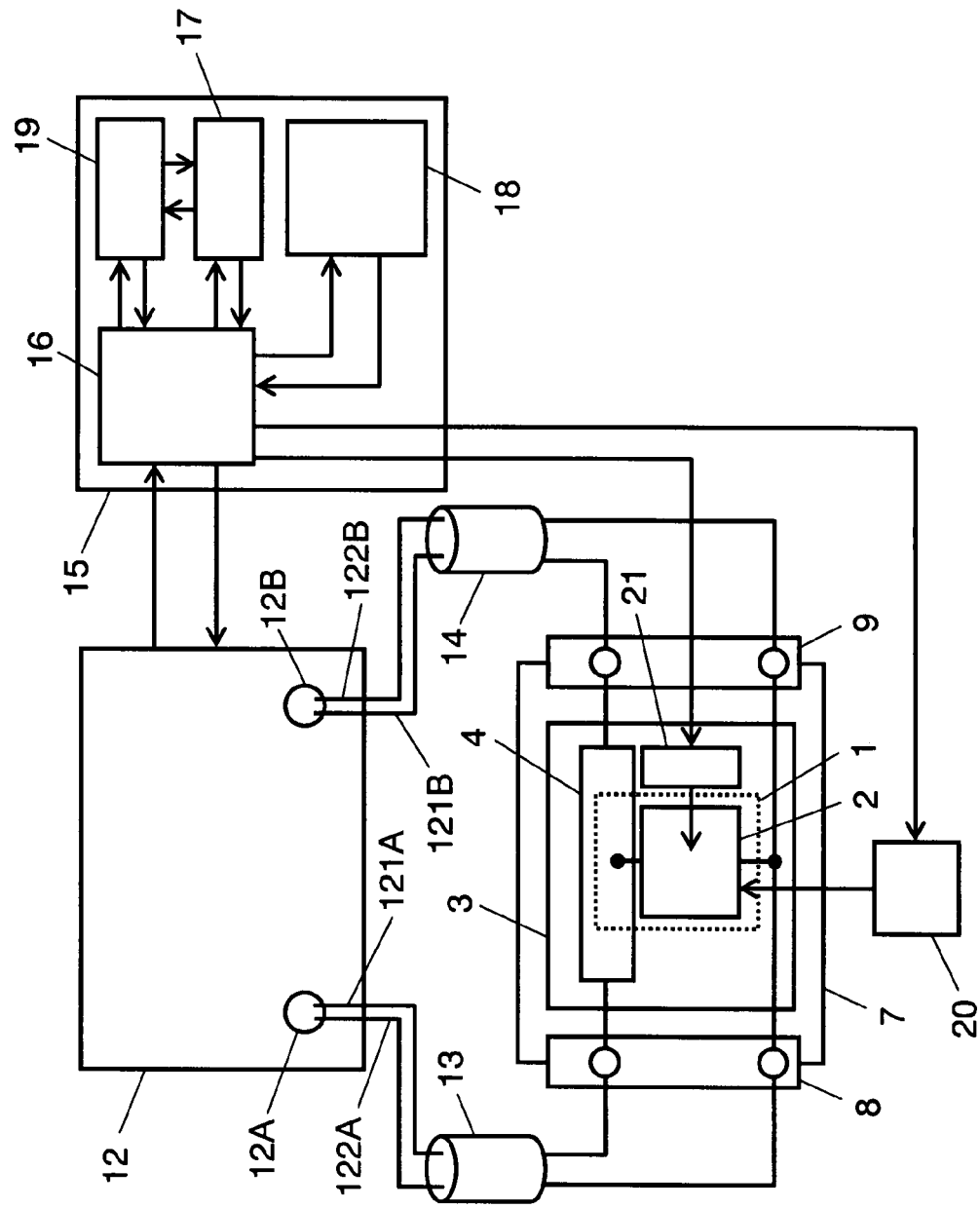
FIG. 1 shows the structure of a solid electrolytic capacitor inspection device in accordance with a first exemplary embodiment of the present invention.
Figure 2A:
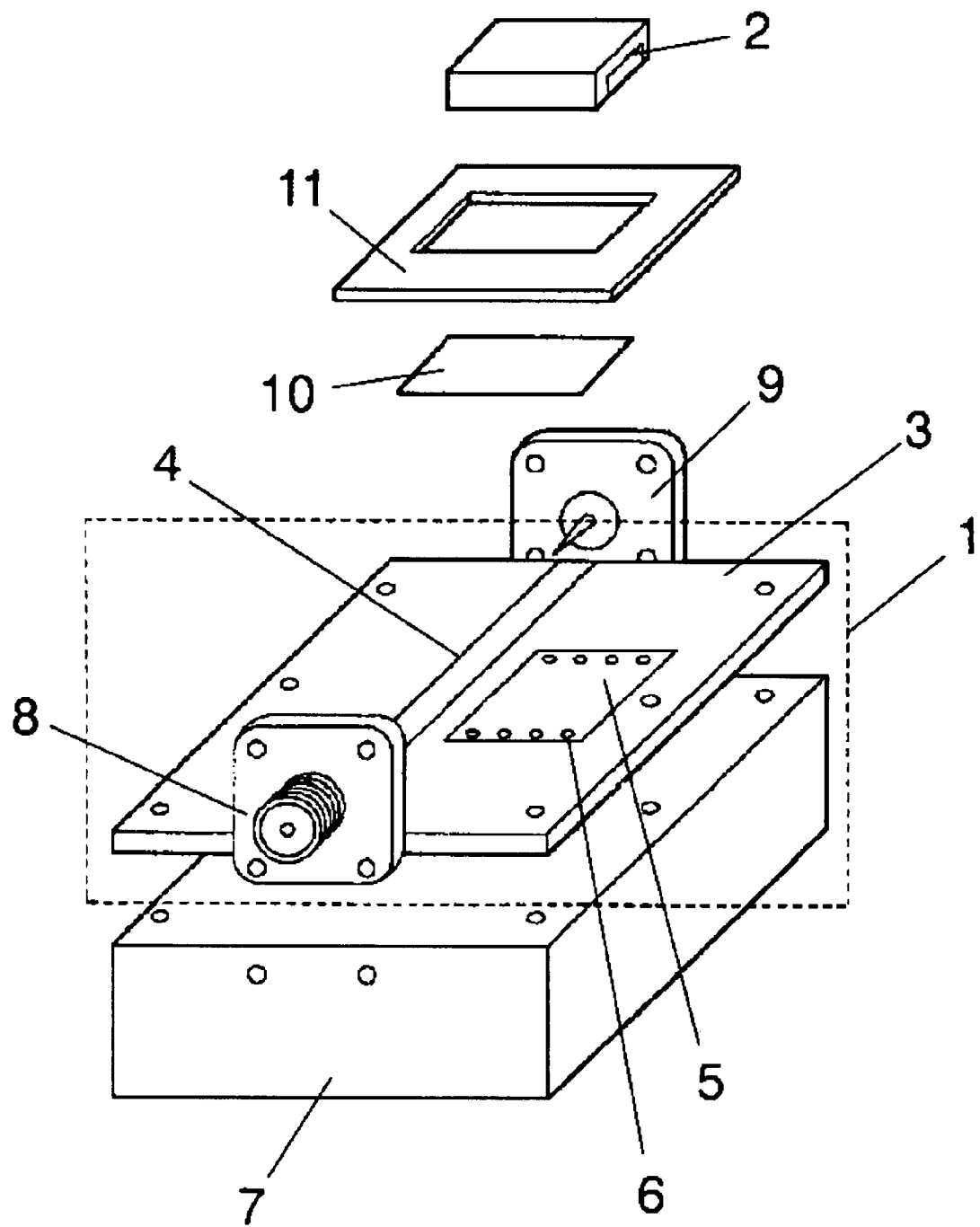
FIG. 2A is an exploded perspective view showing the measuring section of the inspection device shown in FIG. 1.
Figure 2B:
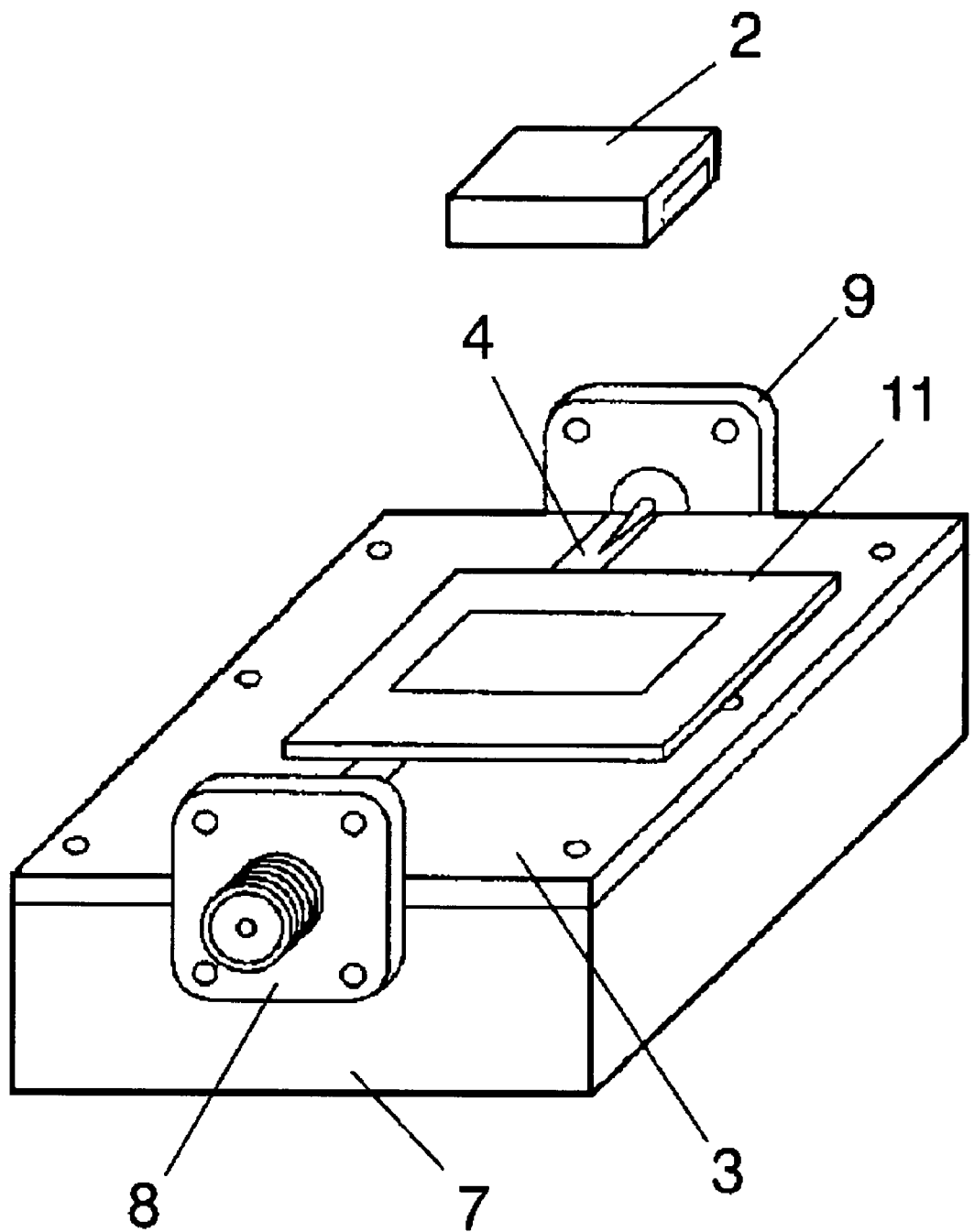
FIG. 2B is a perspective view showing the appearance of the measuring section of the inspection device shown in FIG. 1.
Figure 2C:
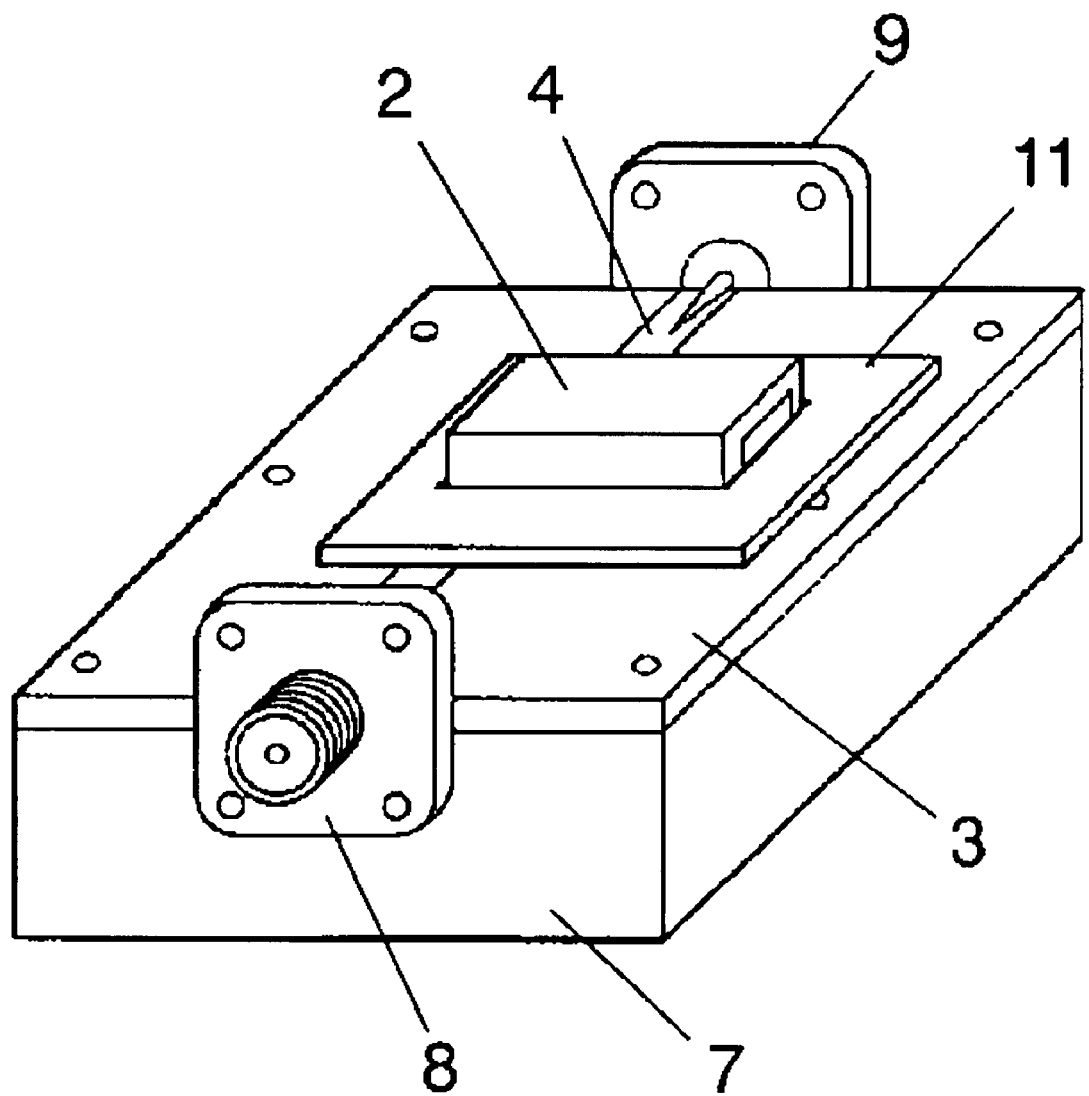
FIG. 2C is a perspective view showing the appearance of the measuring section of the inspection device shown in FIG. 1, loaded with an object of measurement.

FIG. 1 is a conceptual view of the structure of a solid electrolytic capacitor inspection device in accordance with a first exemplary embodiment of the present invention. FIG. 2A through FIG. 2C are perspective view of the measuring section of the inspection device; namely, an exploded perspective view, a perspective view showing the appearance, and that with an object of measurement loaded thereon, respectively. Solid electrolyte capacitor (hereinafter referred to as capacitor) 2, which is the object of measurement, is placed on measuring section 1.

Substrate 3 made of an insulating material is the main part of measuring section 1. Substrate 3 is provided with micro strip line 4 of 50Ω, which is a first conductor unit, and cathode electrode 5, which is a second conductor unit. Both are formed on a first surface by means of a plating process. When micro strip line 4 makes contact with the anode of capacitor 2, it outputs a signal. Cathode electrode 5 makes contact with the cathode of capacitor 2. A second surface of substrate 3 opposite the first surface is plated for the entire surface (not shown). The plated face on the second surface is electrically connected with cathode electrode 5 which is on the first surface, via a plurality of through-hole electrodes 6 provided penetrating through substrate 3 at cathode electrode 5. Substrate 3 is connected to fixing base 7, which is made of metal. Thus, fixing base 7 functions as the ground connected with the cathode of capacitor 2.

Input-side coaxial connector (connector) 8, which is a signal input unit, delivers signals to micro strip line 4 disposed on substrate 3. Output-side coaxial connector (connector) 9, which is a signal output unit, takes signals out from micro strip line 4. Namely, the core wires of connectors 8, 9 are connected to micro strip line 4, while the ground sides of connectors 8, 9 are connected to cathode electrode 5 via fixing base 7. Connectors 8, 9 are attached to substrate 3.

Conductive sheet 10 of approximately the same size as cathode electrode 5 has elastic property, and is provided on the first surface of substrate 3. In addition, a conductive sheet of approximately the same size as the anode of capacitor 2 made of the same material as conductive sheet 10 is disposed between micro strip line 4 and the anode of capacitor 2. In other words, it is preferred to provide the elastic conductive sheets on micro strip line 4 and on cathode electrode 5, respectively. This improves the stability of contacts between cathode electrode 5 and the cathode of capacitor 2, and between micro strip line 4 and the anode of capacitor 2, respectively. In the drawings, only conductive sheet 10 is shown.

Positioning board 11 made of an insulating material positions capacitor 2 to a certain specific location. The use of positioning board 11 contributes to measuring the impedance of capacitor 2 precisely.

Network analyzer 12 is provided with input port (port) 12A and output port (port) 12B. Port 12A is connected with connector 8 via coaxial cable 13, while port 12B is connected with connector 9 via coaxial cable 14. Port 12A consists of signal line 121A, which is an input signal line, and ground line 122A, which is an input-side ground line. Port 12B consists of signal line 121B, which is an output signal line, and ground line 122B, which is an output-side ground line. In the above setup, an input signal with a certain fixed power is delivered to port 12A. The frequency of the input signal is swept. Then, an incident wave to port 12A and the reflection wave to port 12B are compared so that an impedance of measuring section 1 is obtained from the ratio of the waves.

Personal computer 15 includes control unit 16, operation section 17, display section 18 and memory unit 19. Operation section 17 calculates impedance of capacitor 2 through a method to be described later. Display section 18 displays the impedance calculated by operation section 17, or impedance-related information. Memory unit 19 stores the impedance calculated by operation section 17 or the impedance-related information. A user can inspect capacitor 2, control the characteristics or the like of capacitor 2, by using control unit 16 based on the statistics stored in memory unit 19. These functions of control unit 16, operation section 17, display section 18 and memory unit 19 can be integrated to be handled by personal computer 15. Or, each of these functions may be handled by an individual dedicated hardware; or, two or more of them may be integrated for handling by an individual hardware.

Control unit 16 controls feeding section 20 and pressurizing unit 21 as well as operation section 17, display section 18 and memory unit 19. Feeding section 20 delivers capacitor 2 on measuring section 1, and takes it out of the place. Feeding section 20 can be fabricated with parts-feeding mechanisms readily available in the market.

Pressurizing unit 21 is configured to press capacitor 2 which has been delivered to measuring section 1, onto measuring section 1. Namely, pressurizing unit 21 presses the anode of capacitor 2 onto micro strip line 4 and the cathode onto cathode electrode 5, respectively. Pressurizing unit 21 can be fabricated with, for example, an electromagnetic valve which controls a compressed air and a piston which is driven by the compressed air supplied via the electromagnetic valve.

Figure 3:
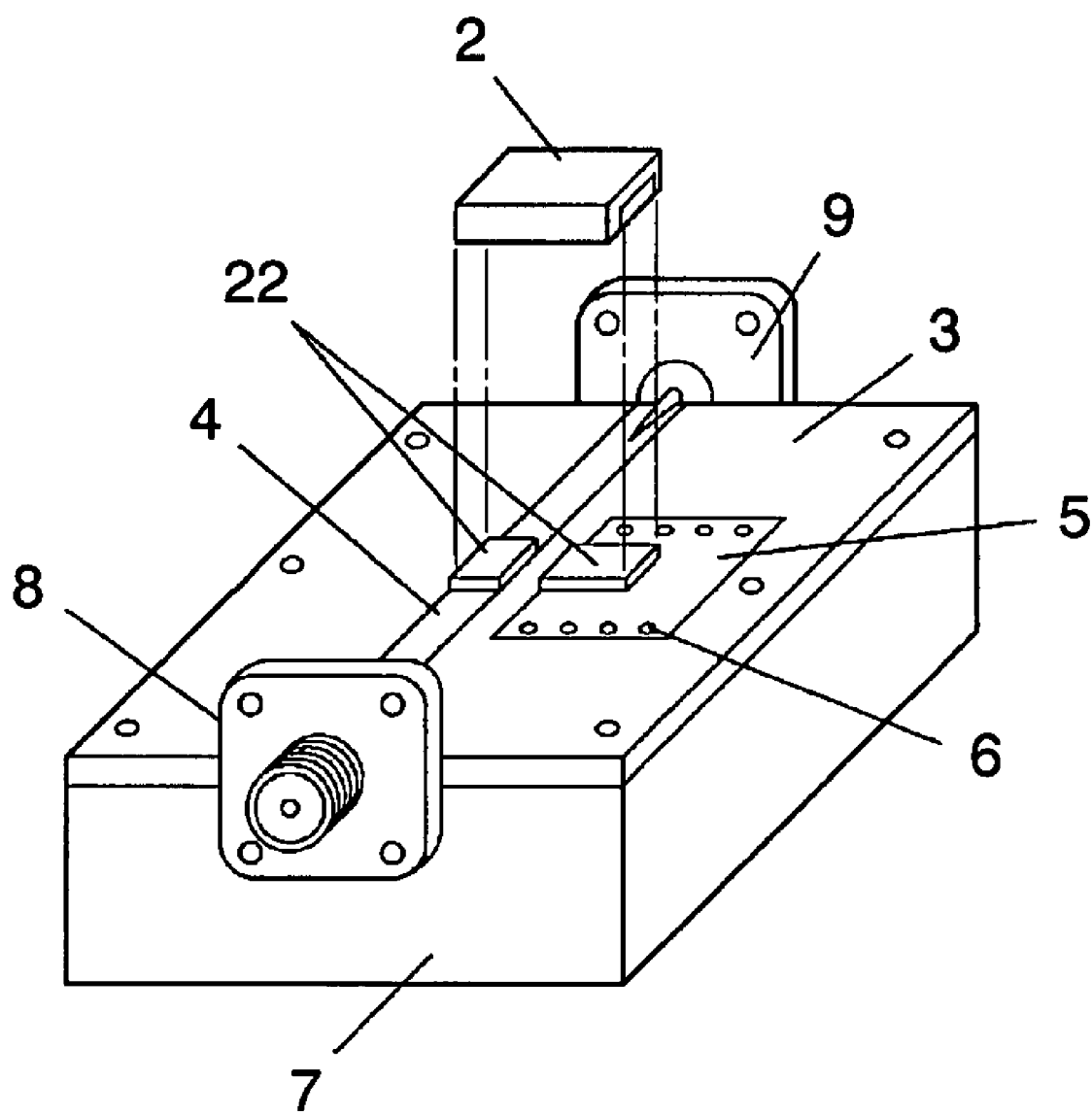
FIG. 3 is a perspective view showing the appearance of another measuring section of a solid electrolytic capacitor inspection device in the first exemplary embodiment.

As shown in FIG. 3, protruding part 22 may be formed by means of plating or other process on micro strip line 4 and cathode electrode 5, respectively. This contributes to improving the stability of contact between capacitor 2 and measuring section 1.

Figure 4A:
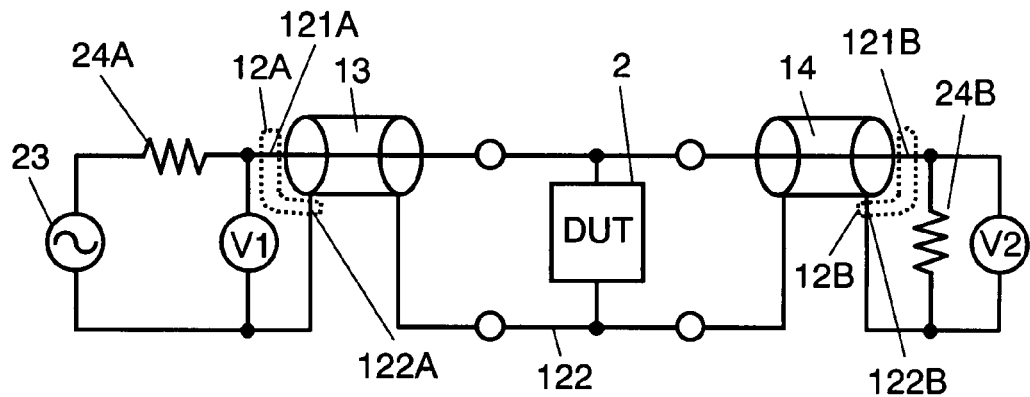
FIG. 4A is a circuit diagram showing a method of connecting a capacitor in accordance with the first exemplary embodiment of the present invention.

Now in the following, a method of measuring the ESL with the above-configured solid electrolytic capacitor inspection device is described practically. FIG. 4A is a circuit diagram which shows the connecting pattern of capacitor 2, which is an object of inspection, in a measuring method in accordance with the present embodiment. The measuring method in the present embodiment is generally called as the series shunt method, among the two-port measurement methods. In the four-terminal net of the circuit diagram, signal line 121A of port 12A is connected with signal line 121B of port 12B, and ground line 122A of port 12A is connected with ground line 122B of port 12B. Capacitor 2 is connected to the vicinity of the middle of connected signal lines 121A, 122A, and to ground 122. Signal source 23 is included in network analyzer 12, and is connected to capacitor 2 via input/output load 24A with a constant magnitude and signal line 121A.

Figure 5:
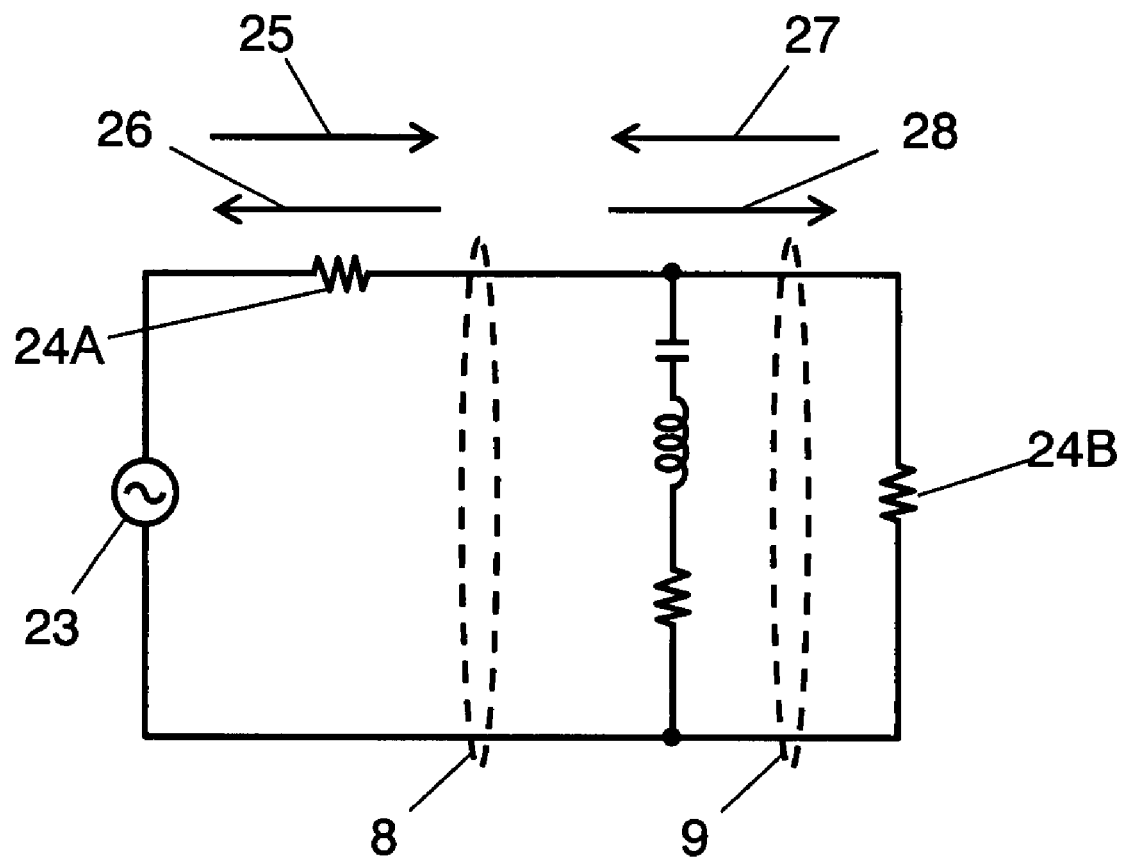
FIG. 5 is a circuit diagram showing a method of measuring the ESL of a capacitor in accordance with the first exemplary embodiment of the present invention.

FIG. 5 is a typified circuit diagram used to describe the principle of measuring an ESL of capacitor 2 with the circuit of FIG. 4A. A signal at a certain fixed power from signal source 23C is applied to capacitor 2 connected in parallel with input/output load 24B. The frequency of the signal is swept. Network analyzer 12 measures intensity a1 of first incident wave 25 and intensity b1 of first reflection wave 26 to port 12A, and intensity a2 of second incident wave 27 and intensity b2 of second reflection wave 28 to port 12B, respectively. On the basis of these measurements, S parameters (also referred to as an S parameter herein) can be obtained. Relation between respective components S11, S12, S21, S22 of S parameter and the respective intensities is exhibited by Formula 1.

$$\begin{pmatrix} b1 \\ b2 \end{pmatrix} = \begin{pmatrix} S11 & S21 \\ S21 & S22 \end{pmatrix} \begin{pmatrix} a1 \\ a2 \end{pmatrix};$$ (Formula 1)

Figure 6:
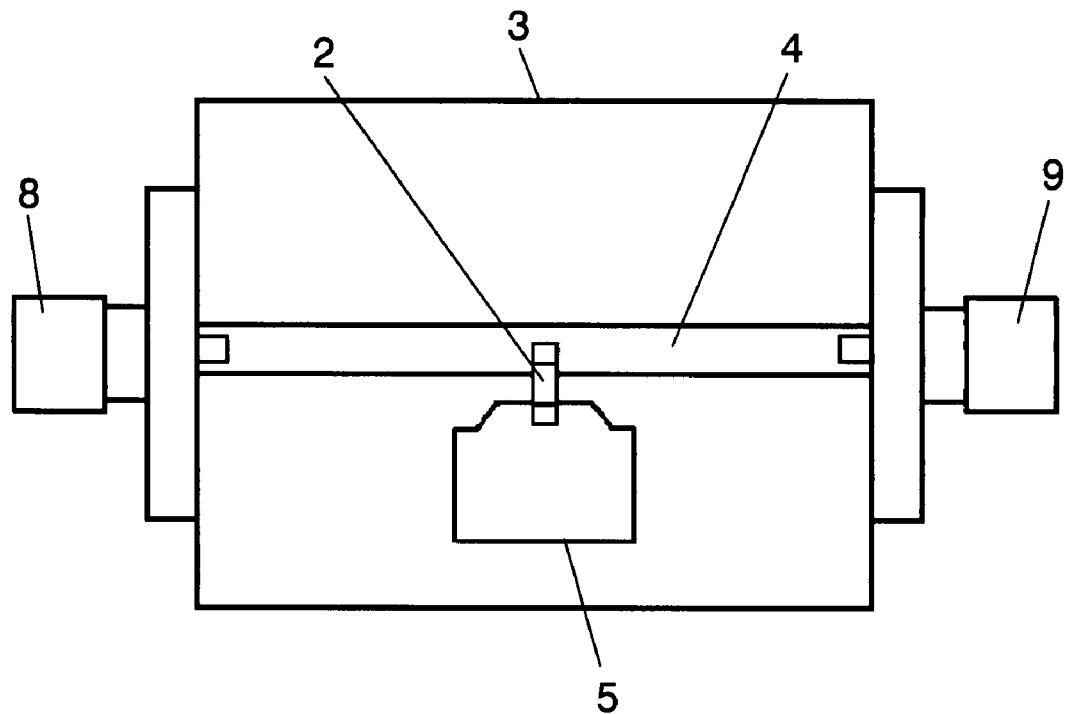
FIG. 6 is a plan view showing a method of connecting a capacitor in accordance with the first exemplary embodiment of the present invention.
Figure 7:
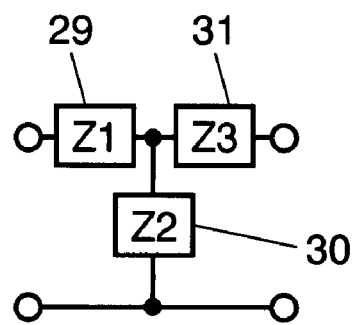
FIG. 7 is an equivalent circuit diagram showing the measuring section in the first exemplary embodiment of the present invention.

FIG. 6 shows capacitor 2, as viewed from the above, which is mounted on substrate 3 and connected in accordance with the connection method of FIG. 4A. FIG. 7 is a circuit diagram corresponding to the structure shown in FIG. 6; which circuit is generally referred to as the type T circuit. First impedance element 29, which is represented by impedance Z1, is the input-side circuit impedance. Second impedance element 30, which is represented by impedance Z2, corresponds to capacitor 2. Third impedance element 31 indicated as impedance Z3 represents the output-side circuit impedance.

Meanwhile, the Z parameter which is the open circuit impedance parameter of the two-port network is exhibited by Formula 2. Here, since Z12 at the second row of first line of the Z parameter is identical with impedance Z2 at the second row of first line of Z parameter corresponding to the T type circuit, Formula 3 is established as shown below.

$$(Z) = \begin{pmatrix} Z11 & Z12 \\ Z21 & Z22 \end{pmatrix};$$ (Formula 2)

$$(Z) = \begin{pmatrix} Z11 & Z12 \\ Z21 & Z22 \end{pmatrix} = \begin{pmatrix} Z1+Z2 & Z2 \\ Z2 & Z2+Z3 \end{pmatrix};$$ (Formula 3)

Since there is a relation between the S parameter and Z12 as shown in Formula 4, impedance Z2 of capacitor 2 can be calculated through Formula 4. Thus, an ESL of capacitor 2 can be calculated.

$$Z2 = Z12 = \frac{2S21}{(1-S11)(1-S22) - S12 \times S21};$$ (Formula 4)

As described above, the inspection device in the present embodiment measures the impedance of capacitor 2 through the S parameter by means of network analyzer 12. Further, the inspection device is provided with pressurizing unit 21 for pressing capacitor 2 onto measuring section 1. These help obtaining the ESL of capacitor 2 precisely at a high speed. As a general practice in measuring the impedance of electronic components by way of S parameter using network analyzer 12, the electronic components are soldered on a substrate in order to avoid an influence of the contact resistance. However, the impedance of capacitor 2 can be measured precisely in accordance with the present embodiment where the capacitor is pressed by pressurizing unit 21 onto measuring section 1.

Second Exemplary Embodiment

Figure 4B:
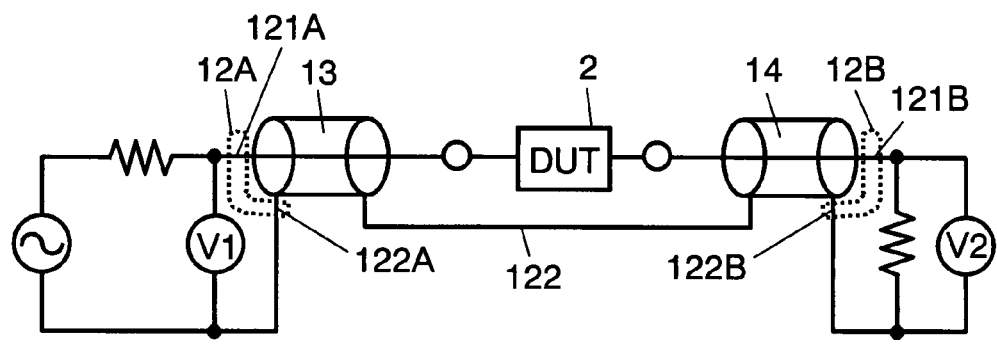
FIG. 4B is a circuit diagram showing a method of connecting a capacitor in accordance with a second exemplary embodiment of the present invention.

FIG. 4B is a circuit diagram which shows the connection pattern of capacitor 2, which is an object of inspection, in a measuring method in accordance with a second embodiment of the present invention. The measuring method in the present embodiment is generally called as the series-through method, among the two-port measurement methods.

In this circuit, capacitor 2 is connected to signal lines 121A and 121B in series in a four-terminal circuit net formed of a combination of signal line 121A and ground line 122A, both of port 12A and signal line 121B and ground line 122B, both of port 12B. Ground line 122A and ground line 122B are connected with each other. Thus, the present embodiment is different from the first embodiment in the connection of capacitor 2, which is the object of inspection. The rest part of the structure remains the same as that of the first exemplary embodiment. However, the arrangement of conductor pattern on substrate 3 and its connection with capacitor 2 are different from those shown in FIG. 1. These points of difference are described below.

Figure 8:
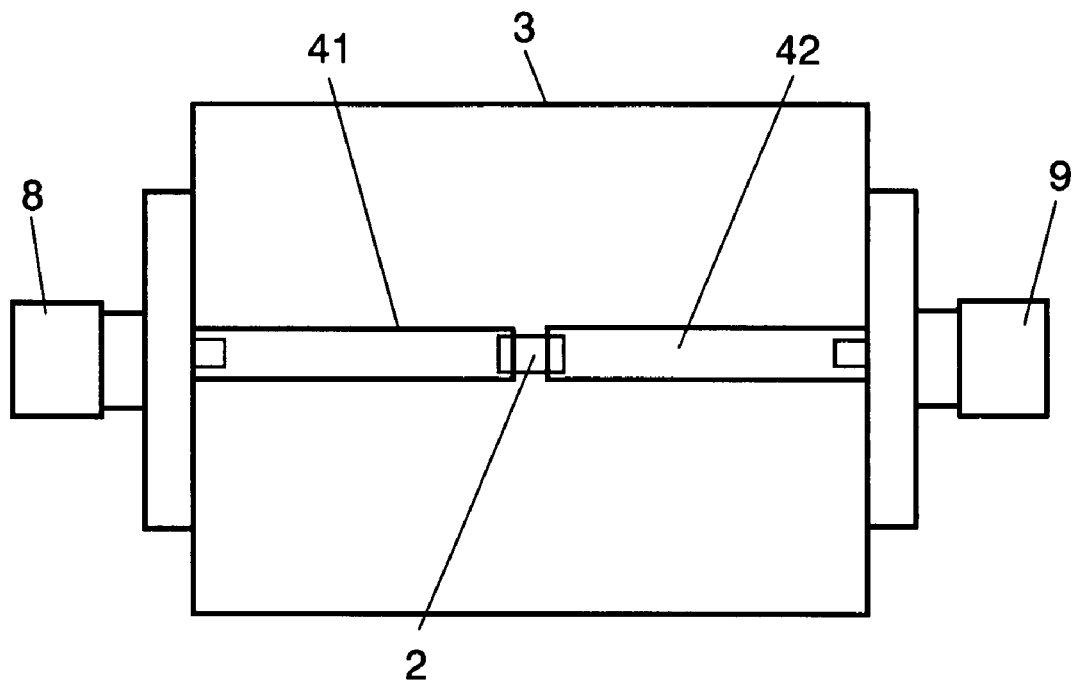
FIG. 8 is a plan view showing a method of connecting a capacitor in accordance with the second exemplary embodiment of the present invention.

FIG. 8 shows the outline of connection in a solid electrolytic capacitor inspection device in accordance with the present embodiment, as viewed from the above. Capacitor 2 is mounted on substrate 3 in accordance with the connection method of FIG. 4B. Cathode electrode 5 is not formed in the present embodiment. The core wire of connector 8 is connected to micro strip line 41, which is a first conductor unit, while the core wire of connector 9 is connected to micro strip line 42, which is a second conductor unit.

Figure 9:
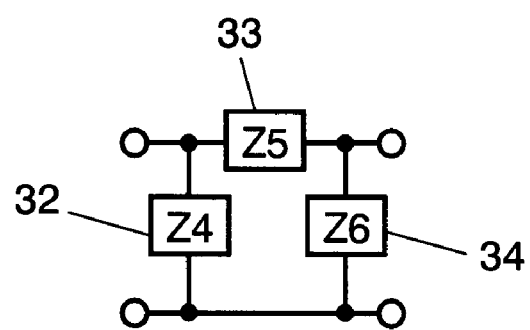
FIG. 9 is an equivalent circuit diagram of a measuring section in the second exemplary embodiment of the present invention.

FIG. 9 is a circuit diagram which corresponds to the structure of FIG. 8. This circuit is generally referred to as the type π circuit diagram. The circuit is formed of first impedance element 32 indicated as impedance Z4, second impedance element 33 indicated as impedance Z5, and third impedance element 34 indicated as impedance Z6. Second impedance element 33 corresponds to capacitor 2.

In the above-described setup, impedance Z5 of capacitor 2 can be obtained by recognizing S parameter at type π circuit, and using the relation of Z parameter with Z5. An ESL of capacitor 2 can be calculated in this way.

As described above, the inspection device in the present embodiment also measures an impedance of capacitor 2 through S parameter using network analyzer 12. Also the inspection device is provided with pressurizing unit 21 for pressing capacitor 2 onto measuring section 1. These help obtaining an ESL of capacitor 2 accurately at a high speed.

Third Exemplary Embodiment

Figure 4C:
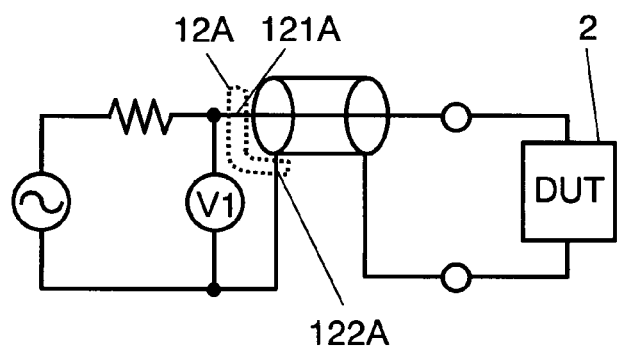
FIG. 4C is a circuit diagram showing a method of connecting a capacitor in accordance with a third exemplary embodiment of the present invention.

FIG. 4C is a circuit diagram which shows the connection pattern of capacitor 2, which is an object of inspection, in accordance with a third exemplary embodiment of the present invention. The connecting method in the present embodiment is generally called as the reflection type, among the one-port measurement methods.

In the present circuit, signal line 121A and ground line 122A, both of port 12A, are connected with capacitor 2, respectively. As compared with the first exemplary embodiment, the present embodiment is different in the connection of capacitor 2, which is object of inspection. The rest portion remains the same as that of the first exemplary embodiment. However, the conductor pattern on substrate 3 and the connection of the conductor pattern with capacitor 2 are different from those shown in FIG. 1. These points of difference are described below.

Figure 10:
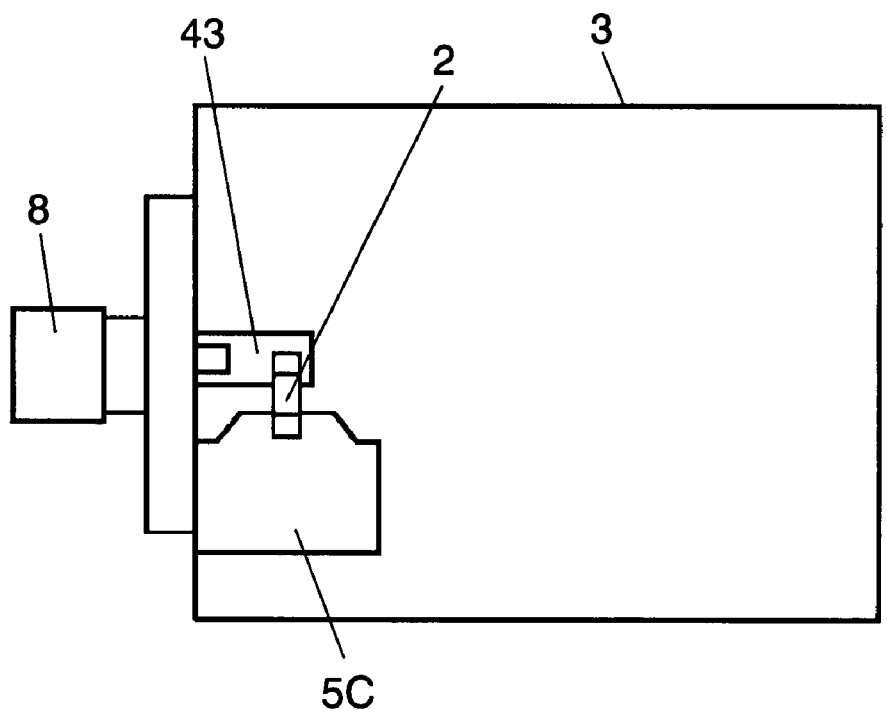
FIG. 10 is a plan view showing a method of connecting a capacitor in accordance with the third exemplary embodiment of the present invention.

FIG. 10 shows outline of the connection in a solid electrolytic capacitor inspection device in accordance with the present embodiment, as viewed from the above. Capacitor 2 is mounted on substrate 3 in accordance with the method of connection shown in FIG. 4C. Connector 9 is not provided in the present embodiment. The core wire of connector 8 is connected to micro strip line 43, which is a first conductor unit, and the ground side of connector 8 is connected to cathode electrode 5C, which is a second conductor unit. Namely, port 12B of FIG. 1 is eliminated; instead, port 12A functions as both an input port and an output port. Connector 8 functions as both a signal input section and a signal output section.

Figure 11:
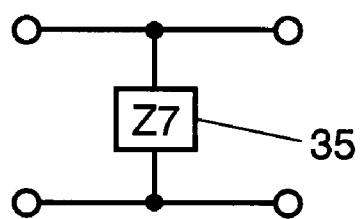
FIG. 11 is an equivalent circuit diagram showing a measuring section in the third exemplary embodiment of the present invention.

FIG. 11 is a circuit diagram which corresponds to the structure of FIG. 10. Impedance element 35 indicated as Z7 represents capacitor 2. An impedance of capacitor 2 is measured also in this structure through network analyzer 12, and an ESL of capacitor can be calculated. The structure in the present embodiment is simple; and the level of measuring accuracy is lower as compared with that in the first and the second exemplary embodiments. However, taking advantage of pressurizing unit 21 which presses capacitor 2 onto measuring section 1, it provides an accurate ESL of capacitor 2 at high speed.

Fourth Exemplary Embodiment

Figure 12:
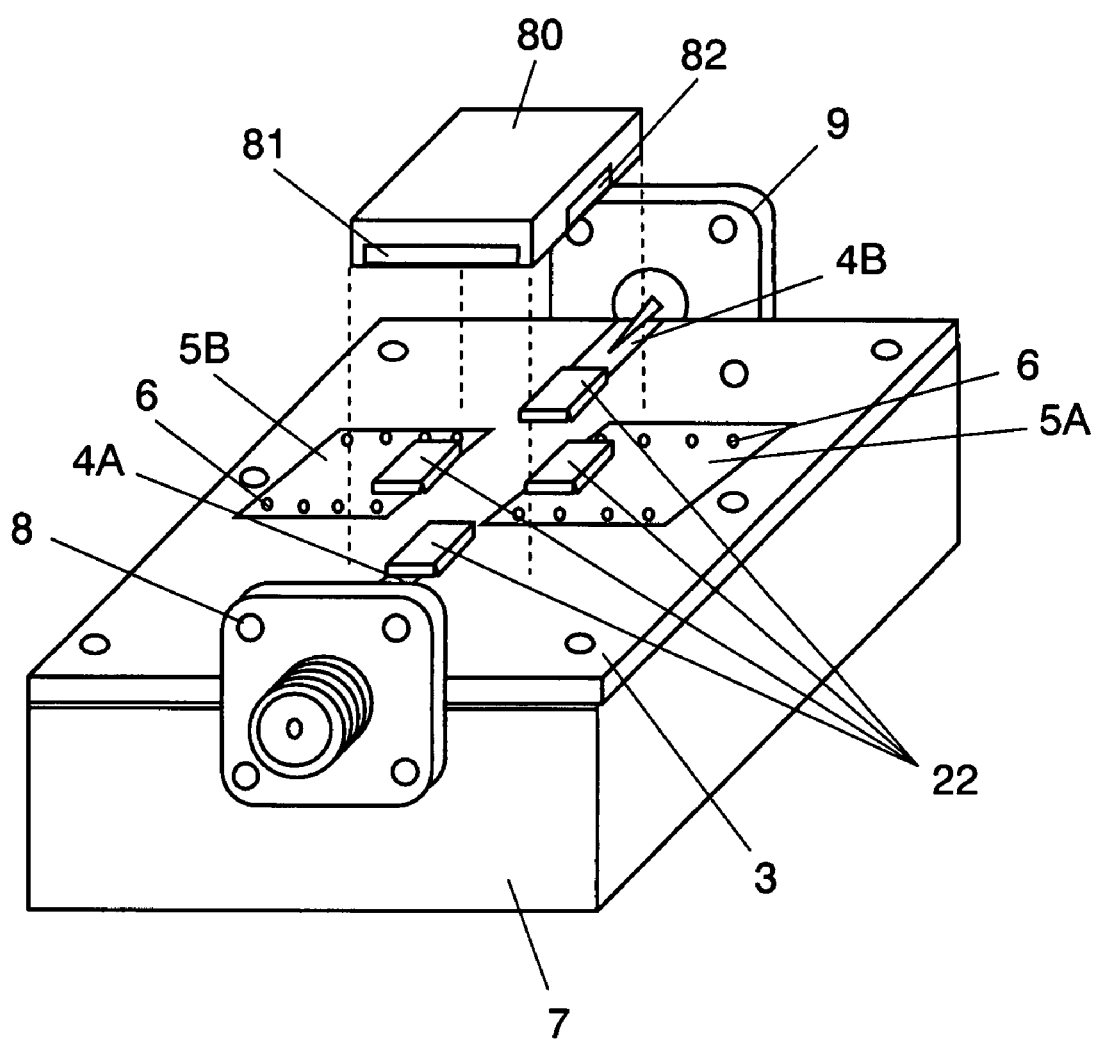
FIG. 12 is a perspective view showing the appearance of a measuring section of an inspection device in accordance with a fourth exemplary embodiment of the present invention.
Figure 13:
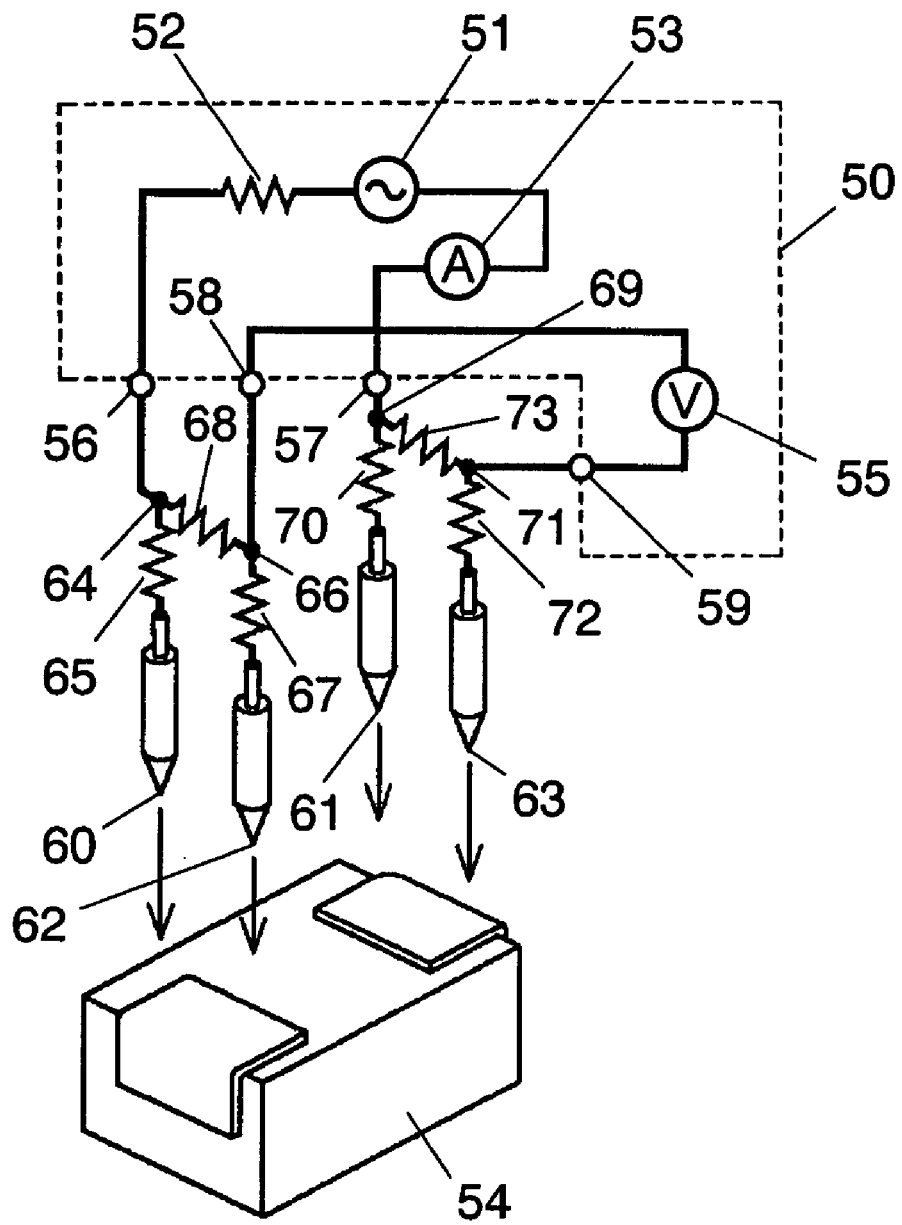
FIG. 13 illustrates the conceptual structure of a conventional solid electrolytic capacitor inspection device.
Figure 14:
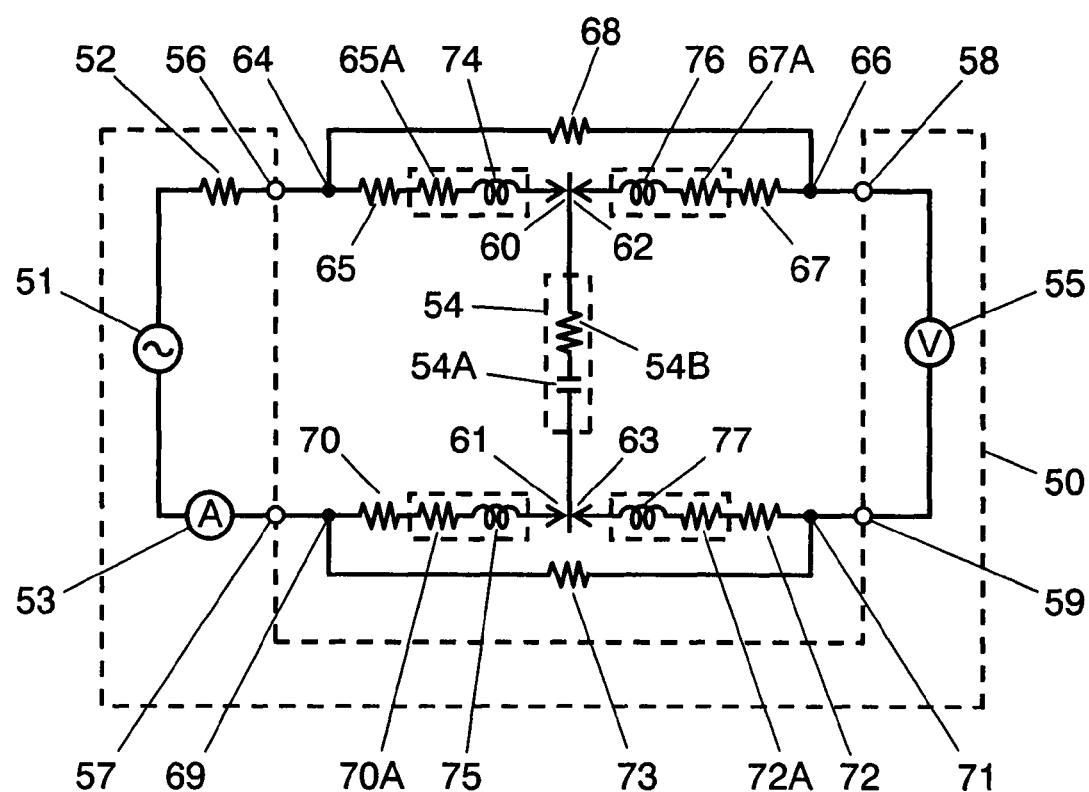
FIG. 14 is an equivalent circuit diagram of the inspection device shown in FIG. 13.

FIG. 12 is a perspective view showing an appearance of a measuring section of an inspection device in accordance with a fourth exemplary embodiment of the present invention. The point of difference as compared with the first exemplary embodiment is that substrate 3 is provided thereon with first micro strip line 4A and second micro strip line 4B, which function as a first conductor unit, and first cathode electrode 5A and second cathode electrode 5B, which function as a second conductor unit. First micro strip line 4A is connected via connector 8 with input signal line 121A of network analyzer 12 which is shown in FIG. 1. Second micro strip line 4B is connected via connector 9 with output signal line 121B of network analyzer 12. First cathode electrode 5A and second cathode electrode 5B are connected with fixing base 7 via through-hole electrode 6 in the same manner as the cathode electrode in the first embodiment; and connected via connector 8, 9 to ground line 122A at the input signal side and ground line 122B at the output signal side, both of network analyzer 12. The rest part of the structure remains the same as that of the first exemplary embodiment.

The inspection device in the present embodiment is suitable for measuring penetration-type capacitor 80. An opposing pair of exterior sides of capacitor 80 are provided respectively with terminal 81 of one polarity, and another opposing pair of exterior sides are provided with terminal 82 of another polarity. First micro strip line 4A, second micro strip line 4B, first cathode electrode 5A and second cathode electrode 5B are disposed so that each of them corresponds to terminals 81, 82. First micro strip line 4A and second micro strip line 4B are disposed so as to be independent each other, without being connected together. Thus, an impedance of penetration type capacitor 80 can be measured accurately at high speed. It is preferred that each of first micro strip line 4A, second micro strip line 4B, first cathode electrode 5A and second cathode electrode 5B is provided with protruding part 22 as shown in FIG. 12. This arrangement contributes to improving the stability of contact.

INDUSTRIAL APPLICABILITY

The structure of the solid electrolytic capacitor inspection device in accordance with the present invention is simple. The input/output of capacitors can be measured precisely by a measuring method using the inspection device without having unwanted resistance, etc. Thus, the solid electrolytic capacitors can be measured precisely with respect to the ESL within a very short time. The inspection device is suitable especially for measuring the equivalent series inductance, among characteristics of solid electrolytic capacitors for use in electronic apparatus. The present inspection device is therefore expected to serve as a solid electrolytic capacitor inspection device.

The invention claimed is:

1. A capacitor inspection device for testing the electrical characteristics of solid electrolytic capacitors, the device comprising:

a substrate made of an insulating material;

a first conductor unit that makes electrical contact with an anode of a solid electrolytic capacitor, and a second conductor unit that makes electrical contact with a cathode of the solid electrolytic capacitor, the first and second conductor unit being provided on a same plane of the substrate as conductor patterns, wherein a first protruding part is provided on an upper surface of the first conductor unit such that an upper surface of the first protruding part is above the upper surface of the first conductor unit, and the second protruding part is provided on an upper surface of the second conductor unit such that an upper surface of the second protruding part is above the upper surface of the second conductor unit and is at a same height as the upper surface of the first protruding part;

first and second conductive sheets each having an elastic property, the first conductive sheet contacting an inferior surface of the anode of the solid electrolytic capacitor and the second conductive sheet contacting an inferior surface of the cathode of the solid electrolytic capacitor, a network analyzer having an input port and an output port;

a signal input unit attached to the substrate and coupled with the input port;

a signal output unit attached to the substrate and coupled with the output port; and a pressurizing unit that presses the anode of the solid electrolytic capacitor to make electrical contact with the first protruding part of the first conductor unit via the first conductive sheet and that presses the cathode of the capacitor to make electrical contact with the second protruding part of the second conductor unit via the second conductive sheet.

2. The capacitor inspection device according to claim 1, wherein a positioning board is disposed on the substrate, the positioning board being configured to position the capacitor in position for measurement.

3. The capacitor inspection device according to claim 1, wherein
the input port is formed of an input signal line and an input-side ground line, the output port is formed of an output signal line and an output-side ground line, the input signal line and the output signal line are connected to the first conductor unit, and the input-side ground line and the output-side ground line are connected to the second conductor unit.

4. The capacitor inspection device according to claim 3, further comprising:
a fixing base made of a metal, the fixing base being configured to hold the substrate, and
a through-hole electrode disposed at the second conductor unit penetrating the substrate, and electrically coupled with the fixing base; wherein
the input-side ground line and the output-side ground line are connected to the fixing base.

5. The capacitor inspection device according to claim 1, wherein
the input port is formed of an input signal line and an input-side ground line, and the output port is formed of an output signal line and an output-side ground line, the input signal line is connected to the first conductor unit, the output signal line is connected to the second conductor unit, and the input-side ground line and the output-side ground line are connected to each other.

6. The capacitor inspection device according to claim 5 further comprising a fixing base made of a metal, the fixing base being configured to hold the substrate, wherein
the input-side ground line and the output-side ground line are electrically connected with the fixing base.

7. The capacitor inspection device according to claim 1, wherein
the input port functions also as the output port, the input port is formed of an input signal line and an input-side ground line, the input signal line is connected to the first conductor unit, and the input-side ground line is connected to the second conductor unit.

8. The capacitor inspection device according to claim 7 further comprising:
a fixing base made of a metal, the fixing base being configured to hold the substrate, and
a through-hole electrode disposed at the second conductor unit penetrating the substrate, and electrically coupled with the fixing base; wherein
the input-side ground line is connected with the fixing base.

9. The capacitor inspection device according to claim 1, wherein
the input port is formed of an input signal line and an input-side ground line, and the output port is formed of an output signal line and an output-side ground line, the first conductor unit is formed of a first micro strip line and a second micro strip line provided independent of the first micro strip line, the second conductor unit is formed of a first cathode electrode and a second cathode electrode; wherein
the input signal line is connected to the first micro strip line, the output signal line is connected to the second micro strip line, the input-side ground line and the output-side ground line are connected with first cathode electrode and second cathode electrode.

10. The capacitor inspection device according to claim 1, further comprising an operation section configured to calculate an impedance of the capacitor by making use of S parameter, which derives from a ratio between an incident wave to the input port and a reflection wave to the output port generated when the network analyzer adds a signal.

11. The capacitor inspection device according to claim 1, wherein the first and second protruding portions are configured to be detachably connected to the capacitor.

12. A method of inspecting a solid electrolytic capacitor comprising:
contacting a first conductive sheet having an elastic property with an inferior surface of an anode of the solid electrolytic capacitor, and a second conductive sheet having an elastic property with an inferior surface of a cathode of the solid electrolytic capacitor, putting the solid electrolytic capacitor on a substrate made of an insulating material so that the anode of capacitor is in electrical contact via the first conductive sheet with a first protruding part provided on an upper surface of a first conductor unit provided on the substrate as a conductor pattern while a cathode of the capacitor is in electrical contact via the second conductive sheet with a second protruding part provided on an upper surface of a second conductor unit provided on a same plane of the substrate as the first conductor unit as a conductor pattern, an upper surface of the first protruding part being above the upper surface of the first conductor unit and an upper surface of the second protruding part being above the upper surface of the second conductor unit and being at a same height as the upper surface of the first protruding part, pressing the solid electrolytic capacitor with respect to the first protruding part of the first conductor unit and the second protruding part of the second conductor unit, applying a signal on the anode of the solid electrolytic capacitor from an input port of network analyzer via a signal input unit attached to the substrate, the network analyzer having the input port and an output port, and calculating an impedance of the solid electrolytic capacitor based on an output delivered to the output port via a signal output unit attached to the substrate and an output delivered to the input port via the signal input unit.

13. The method of inspecting a capacitor according to claim 12, wherein the first and second protruding portions are configured to be detachably connected to the capacitor.

* * * * *